(12) United States Patent
Maeda et al.

(10) Patent No.: US 10,573,509 B2
(45) Date of Patent: Feb. 25, 2020

(54) CLEANING APPARATUS AND SUBSTRATE PROCESSING APPARATUS

(71) Applicant: Ebara Corporation, Tokyo (JP)

(72) Inventors: Koji Maeda, Tokyo (JP); Hiroshi Shimomoto, Tokyo (JP); Kuniaki Yamaguchi, Tokyo (JP); Hiroshi Aono, Tokyo (JP); Tetsuya Yashima, Tokyo (JP); Hidetatsu Isokawa, Tokyo (JP); Kenji Shinkai, Tokyo (JP); Mitsuhiko Inaba, Tokyo (JP); Koichi Hashimoto, Tokyo (JP); Junji Kunisawa, Tokyo (JP); Mitsuru Miyazaki, Tokyo (JP); Fujihiko Toyomasu, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 15/631,149

(22) Filed: Jun. 23, 2017

(65) Prior Publication Data
US 2017/0372893 A1    Dec. 28, 2017

(30) Foreign Application Priority Data

Jun. 27, 2016    (JP) .................................. 2016-127058

(51) Int. Cl.
*H01L 21/02* (2006.01)

(52) U.S. Cl.
CPC .... *H01L 21/02096* (2013.01); *H01L 21/0201* (2013.01); *H01L 21/02068* (2013.01); *H01L 21/02046* (2013.01); *H01L 21/02076* (2013.01); *H01L 21/02085* (2013.01); *H01L 21/02087* (2013.01)

(58) Field of Classification Search
None
See application file for complete search history.

(56) References Cited

U.S. PATENT DOCUMENTS

| | | | | |
|---|---|---|---|---|
| 5,951,779 A * | 9/1999 | Koyanagi | ......... | H01L 21/02052 134/2 |
| 6,155,275 A * | 12/2000 | Shinbara | ........... | H01L 21/67046 134/147 |
| 6,861,371 B2 * | 3/2005 | Kamikawa | ................ | B08B 3/02 134/104.1 |
| 2012/0234364 A1 * | 9/2012 | Muramoto | ........ | H01L 21/67742 134/104.1 |

FOREIGN PATENT DOCUMENTS

JP    11-087462 A    3/1999

* cited by examiner

*Primary Examiner* — Cristi J Tate-Sims
(74) *Attorney, Agent, or Firm* — Abelman, Frayne & Schwab

(57) ABSTRACT

The cleaning apparatus includes multiple kinds of cleaning modules each configured to perform a cleaning processing of a substrate, a first accommodating section configured to accommodate the multiple kinds of cleaning modules therein, and a fluid supply section configured to supply a fluid to the cleaning modules accommodated in the first accommodating section through a pipe. Each of the multiple kinds of cleaning modules includes a pipe connection portion having a common connection position to be connected with the pipe.

11 Claims, 10 Drawing Sheets

CLEANING APPARATUS AND SUBSTRATE PROCESSING APPARATUS

CROSS-REFERENCE TO RELATED APPLICATIONS

This application is based on and claims priority from Japanese Patent Application No. 2016-127058, filed on Jun. 27, 2016, with the Japan Patent Office, the disclosure of which is incorporated herein in its entirety by reference.

TECHNICAL FIELD

The present disclosure relates to a cleaning apparatus and a substrate processing apparatus.

BACKGROUND

In the related art, a substrate processing apparatus is described in, for example, Japanese Patent Laid-Open Publication No. 11-087462. The substrate processing apparatus is a chemical mechanical polishing (CMP) apparatus that flatly polishes a surface of a substrate such as, for example, a silicon wafer. Such a substrate processing apparatus includes a substrate transfer section that transfers a substrate, a polishing section that polishes the substrate, and a cleaning section (cleaning apparatus) that cleans the substrate. The cleaning apparatus includes a cleaning module that removes fine particles such as, for example, residues of slurry used for CMP or metal polishing wastes. As the cleaning module, for example, a roll cleaning module using a roll cleaning member, a pencil cleaning module using a pencil cleaning member, and a two-fluid cleaning module using a two-fluid nozzle are known.

SUMMARY

A cleaning apparatus according to one aspect of the present disclosure includes: multiple kinds of cleaning modules each configured to perform a cleaning processing of a substrate; an accommodating section configured to accommodate the multiple kinds of cleaning modules therein; and a fluid supply section configured to supply a fluid to a cleaning module accommodated in the accommodating section through a pipe, in which each of the multiple kinds of cleaning modules includes a pipe connection portion having a common connection position to be connected with the pipe.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
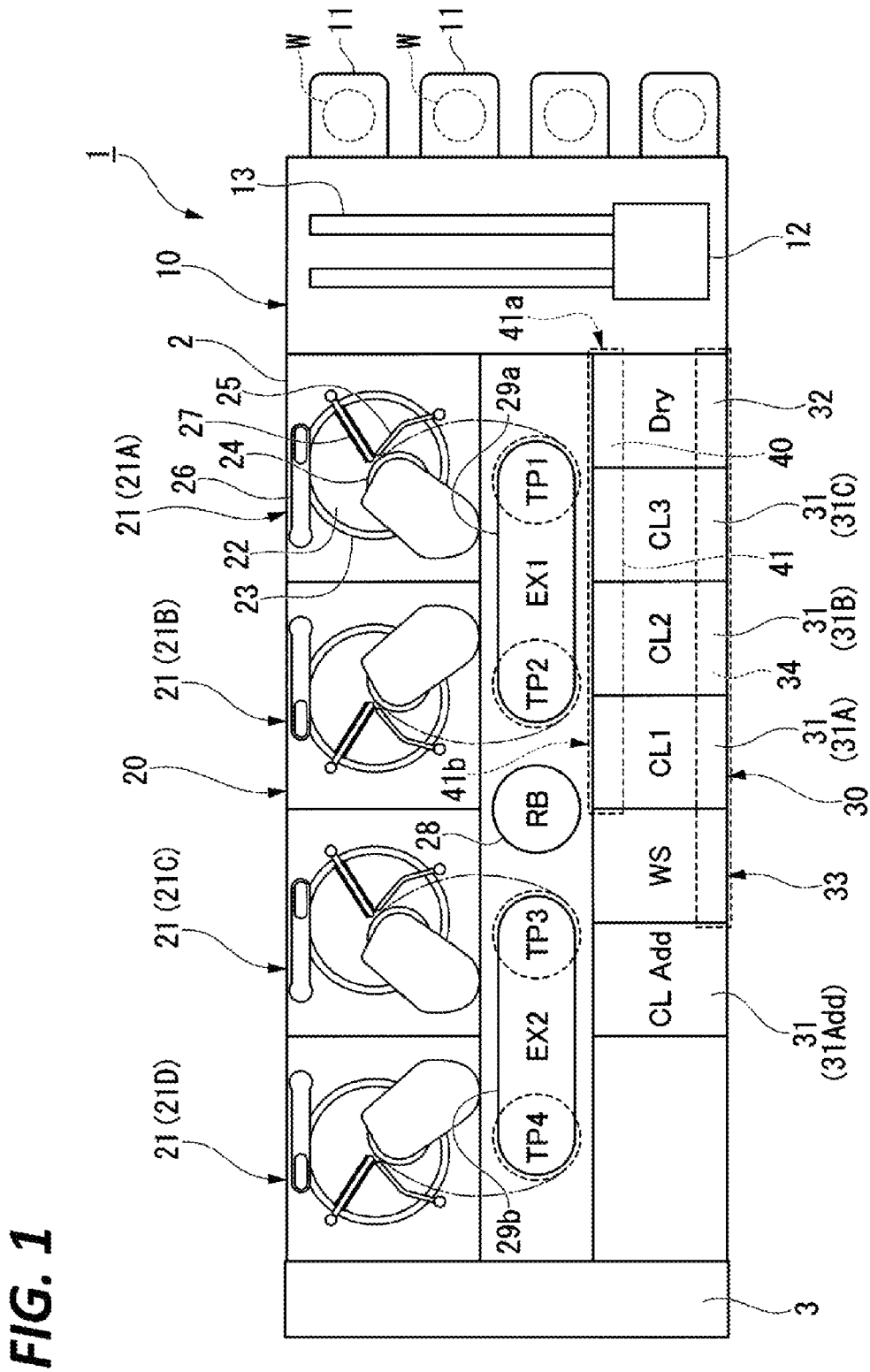
FIG. 1 is a plan view illustrating an overall configuration of a substrate processing apparatus 1 according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the above cleaning apparatus, the cleaning module may be replaced with other kind of cleaning module according to a needed cleaning performance and/or cleaning operation, etc. Since cleaning modules have, for example, different positions for supplying a fluid (e.g., pure water or a chemical liquid) for each kind, when the cleaning module is replaced with another kind of a cleaning module, it is necessary to change not only the cleaning module, but also a connection relationship with a pipe, which supplies the fluid to the cleaning module. Therefore, the replacement operation requires much time and labor.

In addition, in the case of a cleaning apparatus incorporated in a semiconductor manufacturing apparatus, it has recently been required to reduce the footprint (installation area) of the apparatus as much as possible, in order to reduce the size of the semiconductor manufacturing apparatus.

The substrate processing apparatus described in Japanese Patent Laid-Open Publication No. 11-087462 employs a unit structure in which a cleaning module is accommodated in a nest shape in an outer case and a connection pipe system thereof is also mounted in the outer case. With this structure, the cleaning module and the connection pipe system thereof may be replaced at a time. However, in such a unit structure, the size increases, causing deterioration in handling, and thus a burden is imposed on an operator who performs the replacement operation. In addition, when the size increases, for example, it is difficult to clean substrates in parallel with each other in multiple lanes by superimposing the units one on another in the height direction. Meanwhile, when the units are placed on a plane, the footprint of the entire apparatus increases.

The present disclosure has been made in consideration of solving at least one of the above problems, and an object of the present disclosure is to provide a cleaning apparatus and a substrate processing apparatus, which may reduce a burden on the replacement operation of different kinds of cleaning modules, and may also suppress an increase in the footprint of the apparatus.

A cleaning apparatus according to one aspect of the present disclosure includes: multiple kinds of cleaning modules each configured to perform a cleaning processing of a substrate; an accommodating section configured to accommodate the multiple kinds of cleaning modules therein; and a fluid supply section configured to supply a fluid to a cleaning module accommodated in the accommodating section through a pipe, in which each of the multiple kinds of cleaning modules includes a pipe connection portion having a common connection position to be connected with the pipe.

In the cleaning apparatus described above, the fluid supply section may include a pure water pipe configured to supply pure water as the fluid, a chemical liquid pipe configured to supply a chemical liquid as the fluid, and an air pipe configured to supply air for driving the cleaning modules as the fluid, and the pipe connection portion may be connected to at least one of the pure water pipe, the chemical liquid pipe, and the air pipe.

In the cleaning apparatus described above, the multiple kinds of cleaning modules may include: a roll cleaning module including a first rotation mechanism configured to rotate the substrate, a first top surface fluid supply nozzle configured to supply the fluid to a top surface of the substrate, a first bottom surface fluid supply nozzle configured to supply the fluid to a bottom surface of the substrate, and a roll cleaning member configured to rotate while bringing a peripheral surface thereof into contact with the substrate; and a pencil cleaning module including a second rotation mechanism configured to rotate the substrate, a second top surface fluid supply nozzle configured to supply the fluid to the top surface of the substrate, a second bottom surface fluid supply nozzle configured to pass through a rotating shaft of the second rotation mechanism and supply the fluid to the bottom surface of the substrate, and a pencil cleaning member configured to rotate by bringing an end surface thereof into contact with the substrate. The pencil cleaning module may further include: a pipe extension portion configured to communicate with the second bottom surface fluid supply nozzle, led to an outside of a module case from the rotating shaft of the second rotation mechanism, and installed to extend to a connection position at which the first bottom surface fluid supply nozzle is connected to the pipe; and a pipe cover attached to the module case to cover the pipe extension portion.

Meanwhile, the cleaning modules employed in the cleaning apparatus according to one aspect of the present disclosure are not limited to the roll cleaning module and the pencil cleaning module, and in another aspect, of course, other kinds of cleaning modules may be employed.

In the cleaning apparatus described above, each of the multiple kinds of cleaning modules may include a module case having a common size.

In the cleaning apparatus described above, the accommodating section may accommodate the multiple kinds of cleaning modules to be superimposed one on another in a height direction.

The cleaning apparatus described above may further include a second accommodating section configured to accommodate the fluid supply section in a manner in which the fluid supply section is capable of being drawn out. The fluid supply section may include the pipe and a second pipe that is different from the pipe, and all pipes including the pipe and the second pipe are connected to a front side or an inner side of the fluid supply section in a drawing-out direction.

In the cleaning apparatus described above, at least one of the multiple kinds of cleaning modules may include: a substrate holding unit configured to horizontally hold the bottom surface of the substrate; a module side fluid supply unit configured to supply the fluid to the bottom surface of the substrate held by the substrate holding unit; and a cleaning member configured to comes into contact with and clean the bottom surface of the substrate while the substrate is held by the substrate holding unit.

A substrate processing apparatus according to another aspect of the present disclosure may include: a substrate transfer section configured to transfer a substrate; a polishing section configured to polish the substrate; and a cleaning section configured to clean the substrate, in which the cleaning section may include the cleaning apparatus described above.

According to the aspects of the present disclosure, it is possible to provide a cleaning apparatus and a substrate processing apparatus which are capable of reducing a burden on the replacement operation of different kinds of cleaning modules, and also suppressing an increase in the footprint of the apparatus.

Hereinafter, a cleaning apparatus and a substrate processing apparatus according to an exemplary embodiment of the present invention will be described with reference to the drawings.

FIG. 1 is a plan view illustrating an overall configuration of a substrate processing apparatus 1 according to an exemplary embodiment.

The substrate processing apparatus 1 illustrated in FIG. 1 is a chemical mechanical polishing (CMP) apparatus that flatly polishes the surface of a substrate W such as, for example, a silicon wafer. The substrate processing apparatus 1 includes a housing 2 having a rectangular box shape. The housing 2 is formed in a substantially rectangular shape in a plan view. The inside of the housing 2 is divided, by partition walls, into a loading/unloading section 10, a polishing section 20, and a cleaning section 30. In addition, the substrate processing apparatus 1 includes a substrate transfer section 40 that transfers a substrate W from the loading/unloading section 10 to the polishing section 20, and a controller 3 (control panel) that controls the operations of the loading/unloading section 10, the polishing section 20, the cleaning section 30, and the substrate transfer section 40.

The loading/unloading section 10 includes a front loading unit 11 in which a substrate W is accommodated. Multiple front loading units 11 are provided on one side surface of the housing 2 in the longitudinal direction. The front loading units 11 are arranged in the width direction of the housing 2 (a direction orthogonal to the longitudinal direction in a plan view). Each front loading unit 11 is equipped with, for example, an open cassette, a standard manufacturing interface (SMIF) pod, or a front opening unified pod (FOUP). The SMIF pod or the FOUP is a hermetically sealed container, which accommodates a substrate W cassette therein and is covered with a partition wall. The SMIF or the FOUP may maintain an environment independent of an external space.

In addition, the loading/unloading section 10 includes a transfer robot 12, which loads or unloads a substrate W into or from the front loading units 11, and a traveling mechanism 13, which travels the transfer robot 12 along the arrangement of the front loading units 11. The transfer robot 12 includes two upper and lower hands, which are properly used before and after a processing of the substrate W. For example, the upper hand is used when returning a substrate W to a front loading unit 11, and the lower hand is used when taking out an unprocessed substrate W from a front loading unit 11.

The substrate transfer section 40 includes a substrate transfer path 41, which extends in the longitudinal direction of the housing 2. The substrate transfer path 41 passes through the area in which the cleaning section 30 is disposed in a plan view, and has one end 41*a* that communicates with the loading/unloading section 10 and the other end 41*b* that communicates with the polishing section 20. In the substrate transfer path 41, a slide stage is provided to support a substrate W, and a stage moving mechanism is provided to move the slide stage between the one end 41*a* and the other end 41 *b*. The one end 41*a* is a substrate W loading port, and is usually closed by a shutter, but is opened when the transfer robot 12 of the loading/unloading section 10 accesses. In addition, the other end 41*b* is a substrate W unloading port, and is usually closed by a shutter, but is opened when a transfer robot 28 of the polishing section 20 accesses.

The polishing section 20 includes multiple polishing modules 21 (21A, 21B, 21C and 21D), which perform polishing (or also referred to as "grinding" or "flattening") on a substrate W. The polishing modules 21 are arranged in the longitudinal direction of the housing 2. Each polishing module 21 includes a polishing table 23, which rotates a polishing pad 22 having a polishing surface, a top ring 24, which holds a substrate W and polishes the substrate W while pressing the substrate W against the polishing pad 22 on the polishing table 23, a polishing liquid supply nozzle 25, which supplies a polishing liquid or a dressing liquid (e.g., pure water) to the polishing pad 22, a dresser 26, which performs dressing of the polishing surface of the polishing pad 22, and an atomizer 27, which sprays a mixed fluid of a liquid (e.g., pure water) and a gas (e.g., nitrogen gas) or the liquid (e.g., pure water) onto the polishing surface in a mist form.

The polishing module 21 presses the substrate W against the polishing pad 22 by the top ring 24 while supplying the polishing liquid onto the polishing pad 22 from the polishing liquid supply nozzle 25, and also moves the top ring 24 and the polishing table 23 relative to each other, thereby polishing the substrate W so as to flatten the surface thereof. The dresser 26 includes hard particles such as, for example, diamond particles and ceramic particles that are fixed to a rotating portion on the tip thereof, which is adapted to be brought into contact with the polishing pad 22. The dresser 26 performs uniform dressing on the entire polishing surface of the polishing pad 22 by rotating and oscillating the rotating portion, thereby forming a flat polishing surface. The atomizer 27 washes, for example, polishing wastes or abrasive grains remaining on the polishing surface of the polishing pad 22 with a high pressure fluid, so that the cleaning of the polishing surface and a dressing operation of the polishing surface by the mechanical contact of the dresser 26, that is, the regenerating of the polishing surface are achieved.

In addition, the polishing section 20 includes the transfer robot 28, a first exchanger 29*a*, and a second exchanger 29*b*. In the polishing section 20, a first transfer position TP1, a second transfer position TP2, a third transfer position TP3, and a fourth transfer position TP4 are sequentially set from the loading/unloading section 10 side along the arrangement of the multiple polishing modules 21. The first transfer position TP1, the second transfer position TP2, the third transfer position TP3, and the fourth transfer position TP4 are positions at which substrates W are transferred to the polishing module 21A, the polishing module 21B, the polishing module 21C, and the polishing module 21D, respectively. The polishing modules 21 access the first transfer position TP1, the second transfer position TP2, the third transfer position TP3, and the fourth transfer position TP4, respectively, by the rotation of the arms of the top rings 24.

The transfer robot 28 performs the transfer of substrates W among the substrate transfer section 40, the first exchanger 29*a*, and the second exchanger 29*b*. The transfer robot 28 includes, for example, a hand, which holds a substrate W, a reversing mechanism, which reverses the hand upside down, an extendable arm, which supports the hand, a vertical arm movement mechanism, which vertically moves the arm, and an arm rotation mechanism, which rotates the arm about an axis that extends in the vertical direction. The transfer robot 28 is movable between the second transfer position TP2 and the third transfer position TP3, and distributes substrates W received from the substrate transfer section 40 to the first exchanger 29*a* or the second exchanger 29*b*. In addition, the transfer robot 28 receives substrate W polished by the polishing module 21 from the first exchanger 29*a* or the second exchanger 29*b*, and delivers the substrates W to the cleaning section 30.

The first exchanger 29*a* is a mechanism that transfers a substrate W between the first transfer position TP1 and the second transfer position TP2. The first exchanger 29*a* includes, for example, multiple slide stages, which support the substrate W, a stage moving mechanism, which horizontally moves the respective slide stages at different heights, a first pusher disposed at the first transfer position TP1, and a second pusher A disposed at the second transfer position TP2. Each slide stage has a substantially U-shaped notch portion through which the first pusher or the second pusher may vertically pass, and is moved between the first transfer position TP1 and the second transfer position TP2 by the stage moving mechanism. The first pusher vertically moves at the first transfer position TP1, and performs the transfer of the substrate W between the slide stage and the top ring 24 of the polishing module 21A. In addition, the second pusher vertically moves at the second transfer position TP2 and performs the transfer of the substrate W between the slide stage and the top ring 24 of the polishing module 21B.

The second exchanger 29*b* is a mechanism that transfers a substrate W between the third transfer position TP3 and the fourth transfer position TP4. The second exchanger 29*b* includes, for example, multiple slide stages, which support the substrate W, a stage moving mechanism, which horizontally moves the respective slide stages at different heights, a third pusher disposed at the third transfer position TP3, and a fourth pusher disposed at the fourth transfer position TP4. Each slide stage has a substantially U-shaped notch portion through which the third pusher or the fourth pusher may vertically pass, and is moved between the third transfer position TP3 and the fourth transfer position TP4 by the stage moving mechanism. The third pusher vertically moves at the third transfer position TP3, and performs the transfer of the substrate W between the slide stage and the top ring 24 of the polishing module 21C. In addition, the fourth pusher vertically moves at the fourth transfer position TP4, and performs the transfer of the substrate W between the slide stage and the top ring 24 of the polishing module 21D.

The cleaning section 30 (cleaning apparatus) includes multiple cleaning modules 31 (31A, 31B, 31C, and 31Add), which perform the cleaning of a substrate W, and a drying module 32, which dries the cleaned substrate W. The multiple cleaning modules 31 and the drying module 32 are arranged in the longitudinal direction of the housing 2. A transfer chamber 33 (wafer section) is provided between the cleaning module 31A and the cleaning module 31Add. The transfer chamber 33 is provided with a stage on which the substrate W delivered from the transfer robot 28 is disposed. In addition, the cleaning section 30 includes a substrate transfer mechanism 34, which picks up the substrate W disposed on the stage of the transfer chamber 33 and transfers the substrate W among the multiple cleaning modules 31, the drying module 32, and the transfer chamber 33.

The cleaning module 31A is disposed adjacent to the transfer chamber 33 so as to primarily clean the substrate W. In addition, the cleaning module 31B is disposed adjacent to the cleaning module 31A so as to secondarily clean the substrate W. In addition, the cleaning module 31C is disposed adjacent to the cleaning module 31B so as to tertiarily cleans the substrate W. The drying module 32 is disposed adjacent to the cleaning module 31C so as to perform, for example, Rotagoni drying (iso-propyl alcohol (IPA) drying). Meanwhile, the cleaning module 31Add, which is disposed on the side opposite to the cleaning module 31A across the transfer chamber 33, is added according to a cleaning specification. For example, the substrate W is preliminarily cleaned before the cleaning processing of the cleaning modules 31A, 31B, and 31C. Each cleaning module 31 and the drying module 32 have openings each having a shutter, and the substrate W and the substrate transfer mechanism 34 of the cleaning section, which transfers the substrate Wm, may pass through the openings. After drying, the shutter provided on the partition wall between the drying module 32 and the loading/unloading section 10 is opened, and the substrate W is taken out from the drying module 32 by the transfer robot 12.

Figure 2:
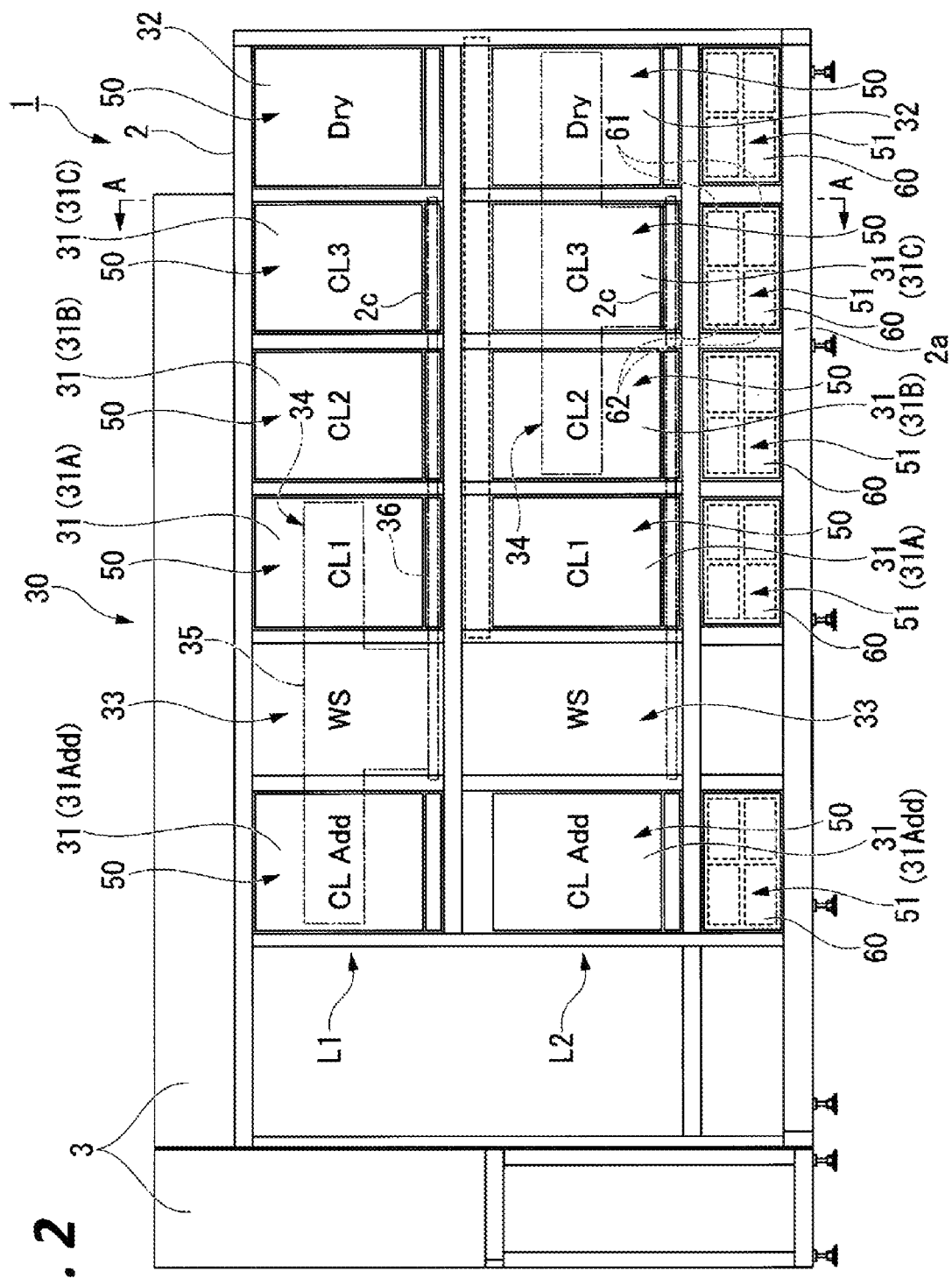
FIG. 2 is a side view illustrating a cleaning section 30 side of the substrate processing apparatus 1 according to an exemplary embodiment.

FIG. 2 is a side view illustrating the cleaning section 30 side of the substrate processing apparatus 1 according to an exemplary embodiment. Meanwhile, in FIG. 2, the loading/unloading section 10 is not illustrated so as to improve visibility.

As illustrated in FIG. 2, the cleaning section 30 includes first accommodating sections 50 (accommodating section) arranged in two upper and lower rows, and second accommodating sections 51 disposed under the first accommodating sections 50. The first accommodating sections 50 and the second accommodating sections 51 are formed in a multi-stage shelf shape by the frame of the housing 2. The first accommodating sections 50 accommodate the cleaning modules 31 and the drying modules 32 in a manner in which the cleaning modules 31 and the drying modules 32 may be drawn out to the front side (the width direction of the housing 2 (the direction perpendicular to the paper plane in FIG. 2)). The second accommodating sections 51 accommodate fluid supply sections 60, which supply a fluid (e.g., pure water, a chemical liquid, or driving air) to the cleaning modules 31 and the drying modules 32, in a manner in which the fluid supply sections 60 may be drawn out to the front side similarly to the first accommodating sections 50.

As illustrated in FIG. 2, the first accommodating sections 50 accommodate the cleaning modules 31 and the drying modules 32 in a manner of being superimposed one on another in the height direction. In other words, the cleaning modules 31 and the drying modules 32 are installed to be stacked one on another in the vertical direction. In the cleaning section 30, the substrates W may be cleaned in parallel with each other in each cleaning module 31 and the drying module 32 in an upper first lane L1 and each cleaning module 31 and the drying module 32 in a lower second lane L2. The substrate transfer mechanism 34 of the cleaning section is provided in each of the first lane L1 and the second lane L2. In addition, each of the transfer chamber 33 has upper and lower stages so as to support the substrates W at the respective heights corresponding to the first lane L1 and the second lane L2.

The substrate transfer mechanism 34 of the cleaning section includes a transfer robot 35, which transfers a substrate, and a traveling mechanism 36, which travels the transfer robot 35 along the arrangement of the cleaning modules 31 and the drying module 32. The transfer robot 35 includes two left and right hands, which are properly used before and after a cleaning processing of substrates W. For example, the left hand is used when unloading a substrate W from the transfer chamber 33 after a polishing processing, and the right hand is used when unloading a substrate W from the cleaning module 31 (e.g., the cleaning module 31C in the latter half of the cleaning processing) after a cleaning processing.

Figure 3:
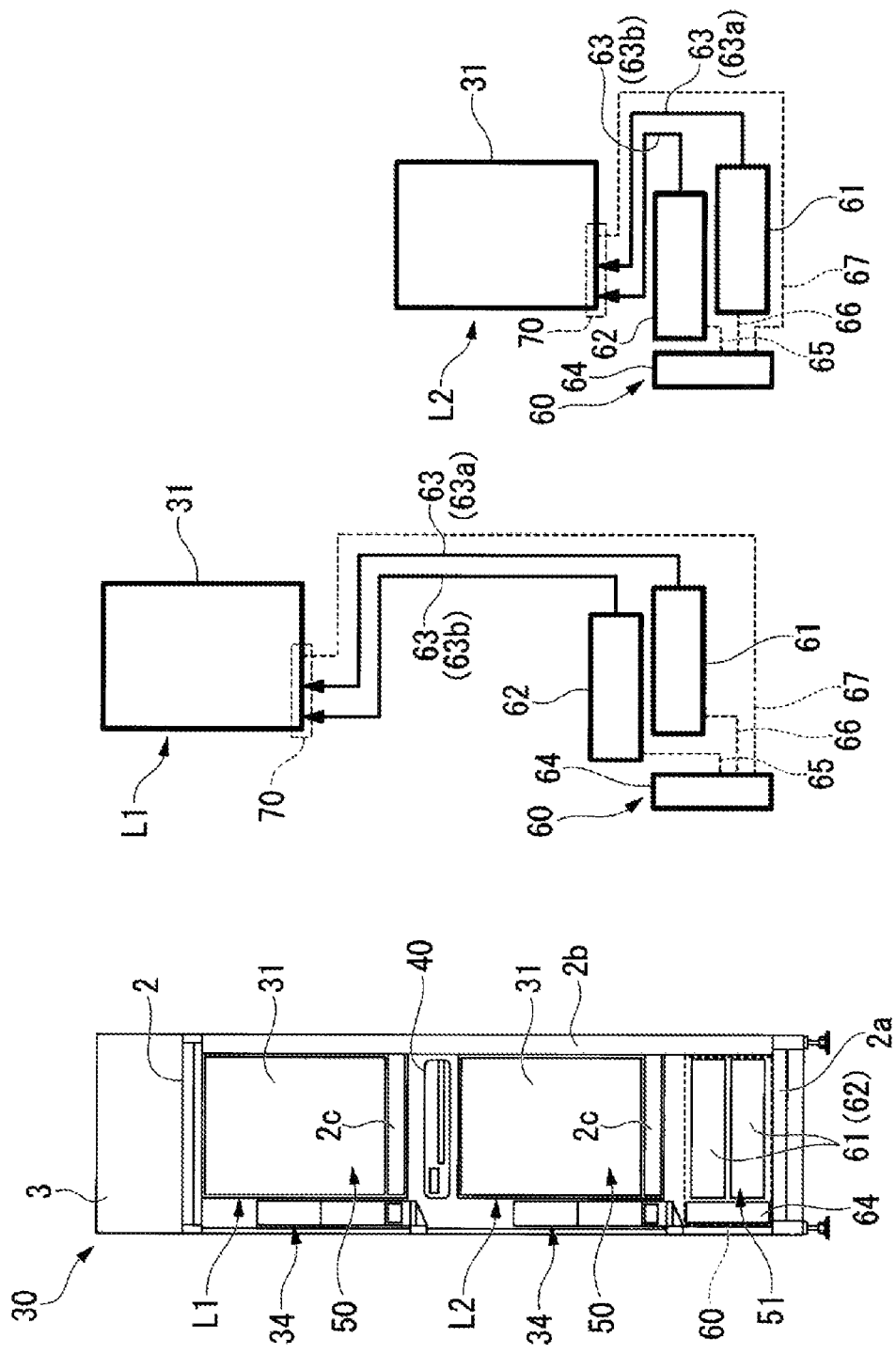
FIG. 3A is a view taken in the direction of arrow A-A of FIG. 2.
FIG. 3B is a schematic view illustrating a connection relationship between a cleaning module 31 and a fluid supply section 60 in a first lane L1.
FIG. 3C is a schematic view illustrating a connection relationship between a cleaning module 31 and a fluid supply section 60 in a second lane L2.

FIG. 3A is a view taken in the direction of arrow A-A of FIG. 2, FIG. 3B is a schematic view illustrating a connection relationship between a cleaning module 31 in the first lane L1 and a fluid supply section 60, and FIG. 3C is a schematic view illustrating a connection relationship between a cleaning module 31 in the second lane L2 and a fluid supply section 60.

As illustrated in FIG. 3A, the substrate transfer mechanism 34 of the cleaning section is disposed on the front side of the cleaning module 31 in the unloading direction (the left side in the drawing), that is, on the inlet side of the first accommodating section 50. Meanwhile, the above-described substrate transfer section 40 is disposed using a gap (space) between the cleaning module 31 disposed in the first lane L1 and the cleaning module 31 disposed in the second lane L2.

Referring back to FIG. 2, the fluid supply sections 60, which supply a fluid to the cleaning modules 31, include a chemical liquid supply unit 61 and a pure water supply unit 62. Each fluid supply section 60 is provided with two chemical liquid supply units 61 and two pure water supply units 62. As illustrated in FIG. 3B, the chemical liquid supply unit 61 and the pure water supply unit 62 arranged at the upper side are connected to the cleaning module 31 disposed in the first lane L1 thereabove via pipes 63 (a chemical liquid pipe 63a and a pure water pipe 63b). In addition, as illustrated in FIG. 3C, the chemical liquid supply unit 61 and the pure water supply unit 62 arranged at the lower side are connected to the cleaning module 31 disposed in the second lane L2 via the pipes 63 (a chemical liquid pipe 63a and a pure water pipe 63b).

Each fluid supply section 60 includes an electrical component attachment unit 64. The electrical component attachment unit 64 includes a chemical liquid supply unit drive system 65, which drives the chemical liquid supply unit 61, a pure water supply unit drive system 66, which drives the pure water supply unit 62, and a module drive system 67, which drives the cleaning module 31. The chemical liquid supply unit drive system 65 and the pure water supply unit drive system 66 include electric wires, which control, for example, pumps that transfer the fluid and control valves that adjust the flow rate of the fluid and air pipes that supply air used to drive air operation valves that open and close the chemical liquid pipe 63a and the pure water pipe 63b. The pumps and the control valves are provided in the chemical liquid supply unit 61 and the pure water supply unit 62. In addition, the module drive system 67 includes, for example, an electric wire that controls an electric drive unit (e.g., a motor) of the cleaning module 31 to be described later, and an air pipe (a pipe) that controls an air drive unit (e.g., an air cylinder) of the cleaning module 31.

For example, the chemical liquid pipe 63a, the pure water pipe 63b, and the electric wire and the air pipe of the module drive system 67 are arranged along a base plate 2a, a back plate 2b, and a shelf plate 2c of the housing 2, which has a shelf shape illustrated in FIG. 3A. That is, for example, the chemical liquid pipe 63a, the pure water pipe 63b, and the electric wire and the air pipe of the module drive system 67 are provided to extend along the base plate 2a, the back plate 2b, and the shelf plate 2c.

As illustrated in FIGS. 3B and 3C, each cleaning module 31 includes a pipe connection portion 70 to which the pipes 63 are connected. The connection position of the pipes 63 in the pipe connection portion 70 is common to the cleaning modules 31 disposed in the first lane L1 and the cleaning modules 31 disposed in the second lane L2. Meanwhile, in the present exemplary embodiment, the connection positions of the electric wire and the air pipe of the module drive system 67 are also common to the cleaning module 31 disposed in the first lane L1 and the cleaning module 31 disposed in the second lane L2.

In addition, each of the cleaning modules 31A, 31B, 31C, and 31Add disposed in the first lane L1 illustrated in FIG. 2 includes the common pipe connection portion 70, so that the connection positions with each fluid supply section 60 in the respective cleaning modules 31A, 31B, 31C, and 31Add are equal to each other. In addition, each of the cleaning modules 31A, 31B, 31C, and 31Add disposed in the second lane L2 also includes the common pipe connection portion 70 such that the connection positions with each fluid supply section 60 in the respective cleaning modules 31A, 31B, 31C, and 31Add are equal to each other. Thus, the connection position between the cleaning module 31 and the fluid supply section 60 is common in any first accommodating section 50 of either of the first lane L1 or the second lane L2. The multiple cleaning modules 31 include multiple kinds of cleaning modules 31, which perform different cleaning processings. For example, cleaning processings in the cleaning module 31A and the cleaning module 31B differ from each other. That is, even if the kinds of the cleaning modules 31 are different, the cleaning modules 31 have a common connection position to be connected with the pipe 63.

Figure 4:
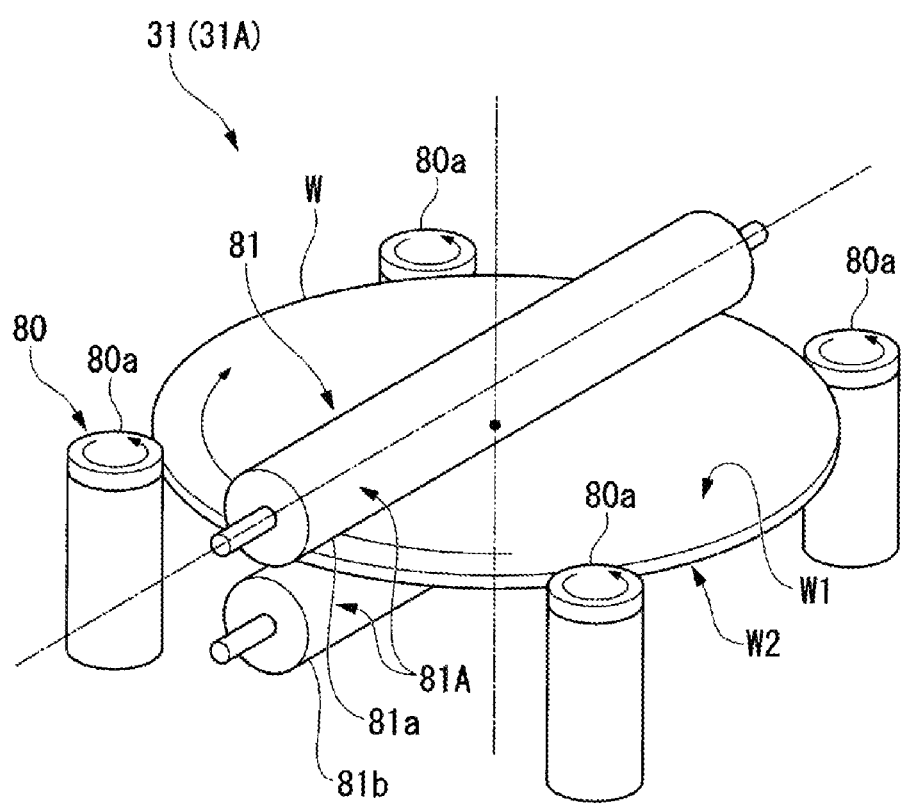
FIG. 4 is a perspective view illustrating a configuration of a cleaning module 31A according to an exemplary embodiment.

FIG. 4 is a perspective view illustrating a configuration of a cleaning module 31A according to an exemplary embodiment.

The cleaning module 31A is, for example, a roll cleaning module as illustrated in FIG. 4. The cleaning module 31A includes a first rotation mechanism 80 that rotates a substrate W, and a roll cleaning member 81 that is rotated by bringing a peripheral surface 81A thereof into contact with the substrate W. The first rotation mechanism 80 includes multiple holding rollers 80a that hold the outer circumference of the substrate W and rotate the substrate W around an axis that extends in the vertical direction. The multiple holding rollers 80a are connected to an electric drive unit such as, for example, a motor to be horizontally rotated. In addition, the multiple holding rollers 80a are configured to be vertically movable by an air drive unit such as, for example, an air cylinder.

The roll cleaning member 81 includes a pair of roll sponges 81a and 81b, which come into contact with the top surface W1 and the bottom surface W2 of the substrate W, an electric drive unit such as, for example, a motor, which rotates the pair of roll sponges 81a and 81b, and an air drive unit such as, for example, an air cylinder, which vertically moves the upper roll sponge 81a. That is, the lower roll sponge 81b is held at a predetermined height. When setting the substrate W, first, the upper roll sponge 81a and the plurality of holding rollers 80a are raised. Next, the substrate W is held by the raised multiple holding rollers 80a, and thereafter, the substrate W is lowered until the bottom surface W2 of the substrate W comes into contact with the lower roll sponge 81b. Finally, the upper roll sponge 81a is lowered to come into contact with the top surface W1 of the substrate W.

Figure 5:
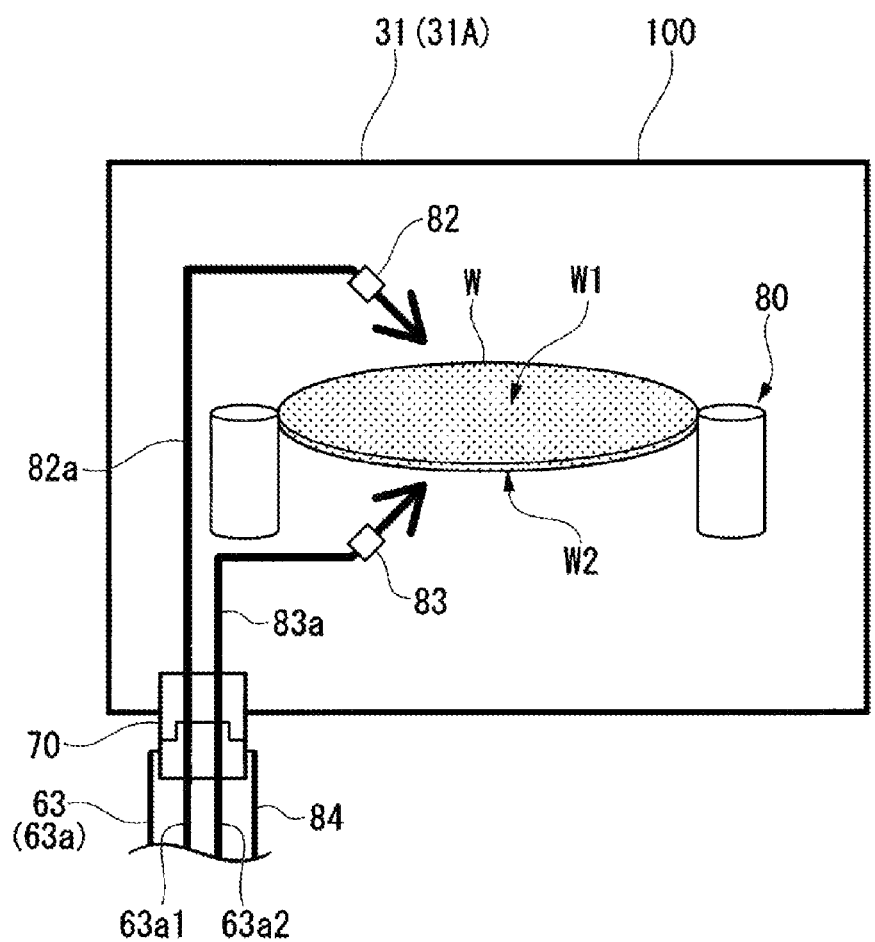
FIG. 5 is a schematic view illustrating a connection relationship between a pipe 63 and a first top surface fluid supply nozzle 82 and a first bottom surface fluid supply nozzle 83 provided in the cleaning module 31A according to the exemplary embodiment.

FIG. 5 is a schematic view illustrating a connection relationship between a pipe 63 and a first top surface fluid supply nozzle 82 and a first bottom surface fluid supply nozzle 83 provided in a cleaning module 31A according to an exemplary embodiment.

As illustrated in FIG. 5, the cleaning module 31A includes a first top surface fluid supply nozzle 82 that supplies a fluid to the top surface W1 of the substrate W, and a first bottom surface fluid supply nozzle 83 that supplies a fluid to the bottom surface W2 of the substrate W. The first top surface fluid supply nozzle 82 is connected to the pipe connection portion 70 via a connection pipe 82a. The pipe connection portion 70 connects the connection pipe 82a to an inner pipe 63a1 (branch pipe) of the chemical liquid pipe 63a. In addition, the first bottom surface fluid supply nozzle 83 is connected to the pipe connection portion 70 via a connection pipe 83a. The pipe connection portion 70 connects the connection pipe 83a to an inner pipe 63a2 (branch pipe) of the chemical liquid pipe 63a. Meanwhile, the inner pipe 63a1 and the inner pipe 63a2 are branched from the chemical liquid supply unit 61, and the outer sides thereof are covered with a protective tube 84.

Meanwhile, although the first top surface fluid supply nozzle 82 and the first bottom surface fluid supply nozzle 83 illustrated in FIG. 5 are connected to the chemical liquid pipe 63a so as to supply a chemical liquid to the top surface W1 and the bottom surface W2 of the substrate W, the pure water pipe 63b has the same configuration as the chemical liquid pipe 63a, and is configured to supply pure water to the top surface W1 and the bottom surface W2 of the substrate W from the same positions as the first top surface fluid supply nozzle 82 and the first bottom surface fluid supply nozzle 83.

In the cleaning module 31A, the substrate W is cleaned as follows. The substrate W is held and rotated by the multiple holding rollers 80a. Next, a chemical liquid is supplied to the top surface W1 and the bottom surface W2 of the substrate W from the first top surface fluid supply nozzle 82 and the first bottom surface fluid supply nozzle 83, respectively. In this state, the pair of roll sponges 81a and 81b are rotated about an axis that extends horizontally and come into sliding contact with the top surface W1 and the bottom surface W2 of the substrate W, so that the top surface W1 and the bottom surface W2 of the substrate W are scrub-cleaned. After the scrub-cleaning, the upper roll sponge 81a and the multiple holding rollers 80a are raised so as to separate the pair of roll sponges 81a and 81b from the substrate W, and pure water is supplied to the top surface W1 and the bottom surface W2 of the substrate W from the same positions as the first top surface fluid supply nozzle 82 and the first bottom surface fluid supply nozzle 83, whereby the substrate W is rinsed.

Figure 6:
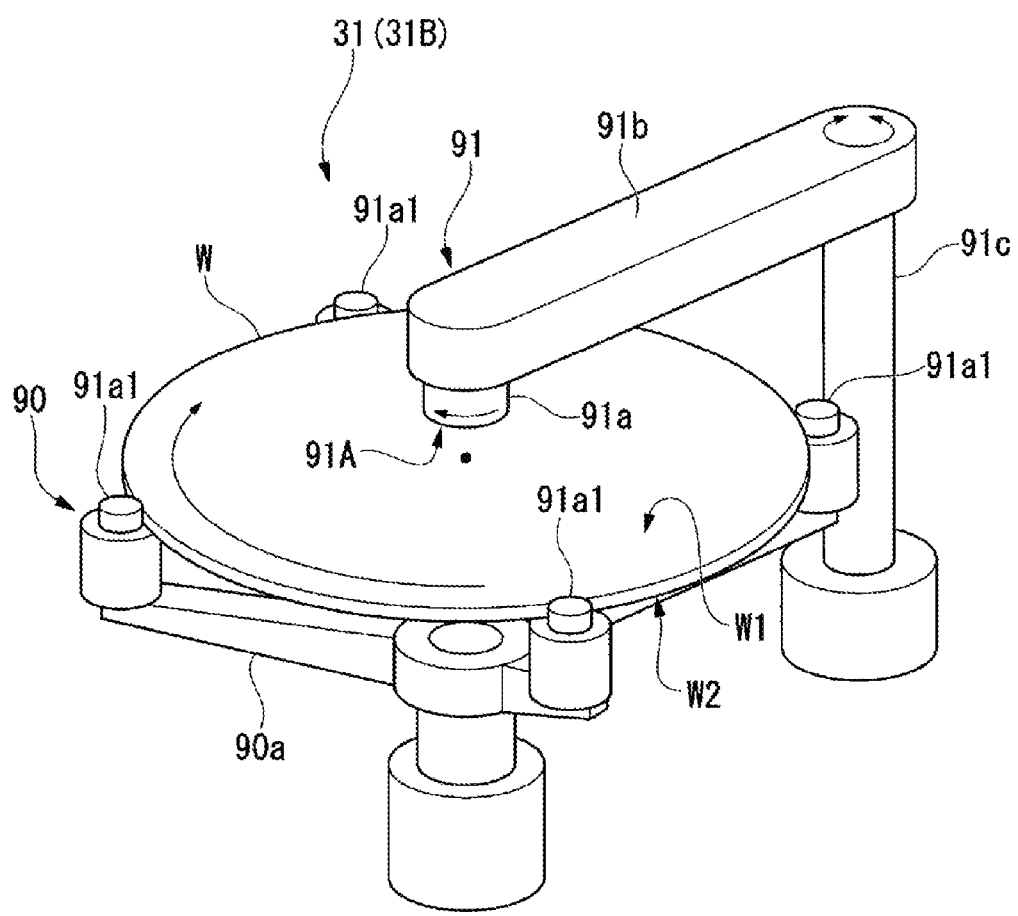
FIG. 6 is a perspective view illustrating a configuration of a cleaning module 31B according to an exemplary embodiment.

FIG. 6 is a perspective view illustrating a configuration of a cleaning module 31B according to an exemplary embodiment.

The cleaning module 31B is, for example, a pencil cleaning module as illustrated in FIG. 6. The cleaning module 31B includes a second rotation mechanism 90 that rotates the substrate W, and a pencil cleaning member 91 that is rotated while bringing an end surface 91A thereof into contact with the substrate W. The second rotation mechanism 90 includes a rotation stage 90a that includes multiple chucks 90a1 configured to hold the outer circumference of the substrate W and rotates the substrate W about an axis that extends in the vertical direction. The rotation stage 90a is rotatably supported on a rotating shaft 90b illustrated in FIG. 7 that will be described later, and is also connected to an electric drive unit such as, for example, a motor to be horizontally rotated.

The pencil cleaning member 91 includes a pen sponge 91a and an arm 91b that holds the pen sponge 91a. The pen sponge 91a is connected to an electric drive unit such as, for example, a motor disposed in the arm 91b, and is rotated about an axis that extends in the vertical direction. The arm 91b is disposed above the substrate W. The pen sponge 91a is connected to one end of the arm 91b, and a pivot shaft 91c is connected to the other end of the arm 91b. An electric drive unit such as, for example, a motor, is connected to the pivot shaft 91c so as to pivot the arm 91b. The arm 91b is configured to pivot about the pivot shaft 91c in a plane parallel to the substrate W. That is, through the pivoting of the arm 91b, the pen sponge 91a supported by the arm 91b moves in the radial direction of the substrate W and comes into contact with the top surface W1 (pattern surface) of the substrate W.

Figure 7:
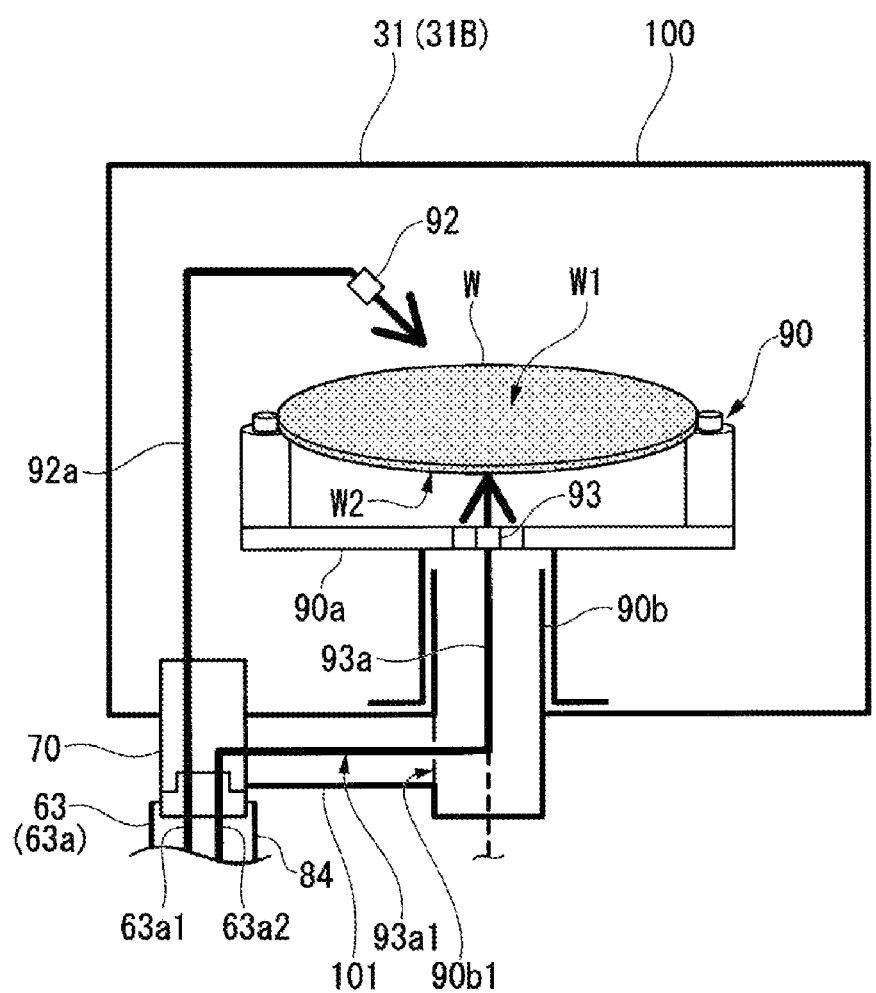
FIG. 7 is a schematic view illustrating a connection relationship between a pipe 63 and a second top surface fluid supply nozzle 92 and a second bottom surface fluid supply nozzle 93 provided in the cleaning module 31B according to the exemplary embodiment.

FIG. 7 is a schematic view illustrating a connection relationship between a second top surface fluid supply nozzle 92 and a second bottom surface fluid supply nozzle 93 provided in a cleaning module 31B according to an exemplary embodiment and the pipe 63.

As illustrated in FIG. 7, the cleaning module 31B includes a second top surface fluid supply nozzle 92 that supplies a fluid to the top surface W1 of a substrate W, and a second bottom surface fluid supply nozzle 93 that supplies a fluid to the bottom surface W2 of the substrate W. The second top surface fluid supply nozzle 92 is connected to a pipe connection portion 70 via a connection pipe 92a. The pipe connection portion 70 connects the connection pipe 92a to an inner pipe 63a1 (branch pipe) of a chemical liquid pipe 63a. The second top surface fluid supply nozzle 92 has the same configuration as the first top surface fluid supply nozzle 82 illustrated in FIG. 5, and also has a common connection position to be connected with the inner pipe 63a1 of the chemical liquid pipe 63a.

The second bottom surface fluid supply nozzle 93 is connected to the pipe connection portion 70 via a connection pipe 93a. The pipe connection portion 70 connects the connection pipe 93a to an inner pipe 63a2 (branch pipe) of the chemical liquid pipe 63a. The second bottom surface fluid supply nozzle 93 is disposed to pass through the rotating shaft 90b of the second rotation mechanism 90 and supply a fluid from the rotation center to the bottom surface W2 of the substrate W. The rotating shaft 90b is connected to a module case 100 of the cleaning module 31B, and has a lower end protruding to the outside of the module case 100. On the lateral side of the lower end of the rotating shaft 90b, an outlet 90b1 is formed so as to allow the connection pipe 93a to protrude to the outside of the module case 100. The connection pipe 93a includes a pipe extension portion 93a1, which extends from the outlet 90b1 to the position at which the first bottom surface fluid supply nozzle 83 illustrated in FIG. 5 is connected to the inner pipe 63a2. As illustrated by the dotted line in FIG. 7, while the pipe extension portion 93a1 takes a different connecting position in order to pass through the rotating shaft 90b in the related art, the pipe extension portion 93a1 extends to the same position as the position at which the first bottom surface fluid supply nozzle 83 is connected to the inner pipe 63a2 (i.e., the position adjacent to the connection position of the inner pipe 63a1 and the second top surface fluid supply nozzle 92).

The pipe extension portion 93a1 is covered with a pipe cover 101, which is attached to the module case 100. Therefore, the pipe extension portion 93a1 is not exposed to the outside between the pipe connection portion 70 and the rotating shaft 90b, and thus, there is no risk that the pipe extension portion 93a1 is caught by a surrounding structure during the replacement operation of the cleaning module 31. Meanwhile, the pipe cover 101 is a substantially U-shaped or arc-shaped cover, and is attached to the module case 100 by, for example, screwing or snap-fitting.

Meanwhile, although the second top surface fluid supply nozzle 92 and the second bottom surface fluid supply nozzle 93 illustrated in FIG. 7 are connected to the chemical liquid pipe 63a so as to supply the chemical liquid to the top surface W1 and the bottom surface W2 of the substrate W, the pure water pipe 63b also has the same configuration as the chemical liquid pipe 63a and is configured to supply pure water to the top surface W1 and the bottom surface W2 of the substrate W from the same positions as the second top surface fluid supply nozzle 92 and the second bottom surface fluid supply nozzle 93.

In the cleaning module 31B, the substrate W is cleaned as follows. The substrate W is held by the multiple chucks 90a1 and rotated together with the rotation stage 90a. Next, the chemical liquid is supplied to the top surface W1 and the bottom surface W2 of the substrate W from the second top surface fluid supply nozzle 92 and the second bottom surface fluid supply nozzle 93, respectively. In this state, the pen sponge 91a is brought into sliding contact with the top surface W1 of the substrate W while rotating about an axis that extends in the vertical direction, and oscillates in the radial direction of the substrate W by the arm 91b. As the pen sponge 91a comes into sliding contact with the top surface W1 of the substrate W under the presence of the chemical liquid, the substrate W is scrub-cleaned. After the scrub-cleaning, the pen sponge 91a is moved outward in the radial direction of the substrate W, and pure water is supplied from the same positions as the second top surface fluid supply nozzle 92 and the second bottom surface fluid supply nozzle 93 to the top surface W1 and the bottom surface W2 of the substrate W, so that the substrate W is rinsed.

Figure 8:
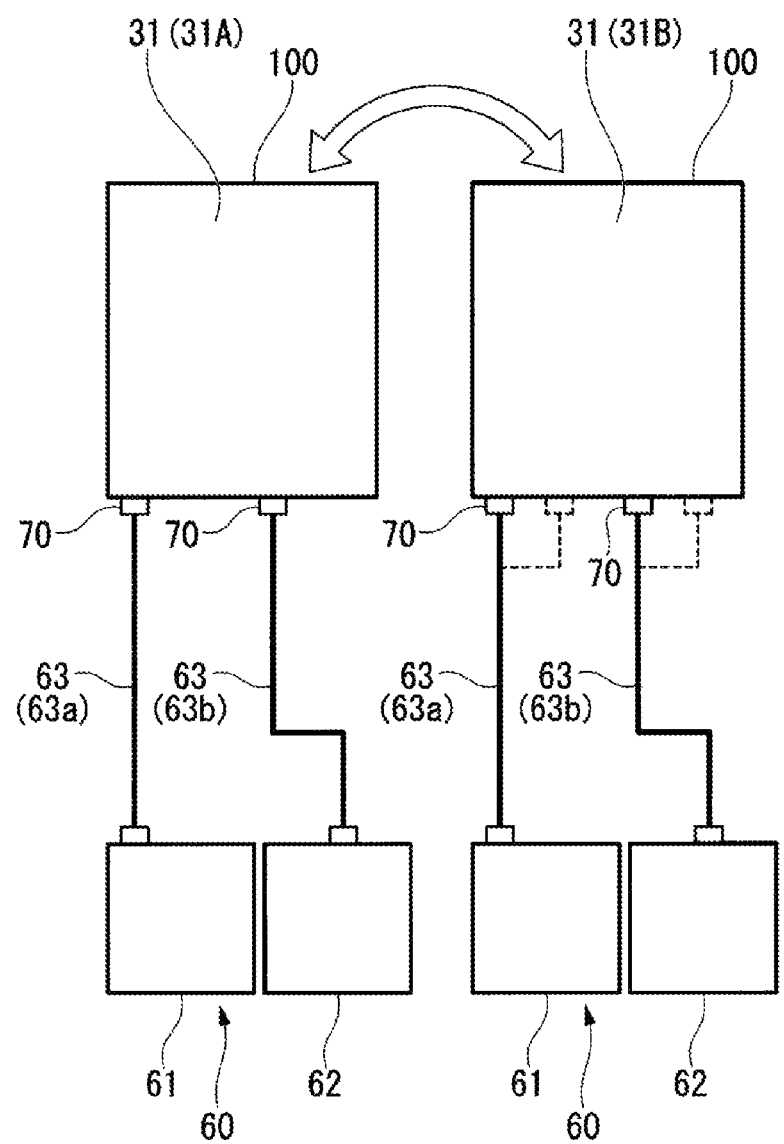
FIG. 8 is a schematic view illustrating a replacement operation of the cleaning module 31A and the cleaning module 31B according to an exemplary embodiment.

FIG. 8 is a schematic view illustrating a replacement operation of a cleaning module 31A and a cleaning module 31B according to an exemplary embodiment.

As illustrated in FIG. 8, each of the cleaning module 31A and the cleaning module 31B includes a pipe connection portion 70 having a common connection position to be connected with the pipe 63. That is, as described above, the cleaning module 31B (pencil cleaning module) supplies a fluid to the bottom surface W2 of the substrate W through the rotating shaft 90b, and therefore, as illustrated by the dotted line in FIG. 8, needed to supply the fluid from two regions in the related art. However, in the present exemplary embodiment, a common connection position to be connected with the pipe 63 is obtained by the pipe extension portion 93a1 and the pipe cover 101 illustrated in FIG. 7. Therefore, as illustrated in FIG. 8, even when the cleaning module 31A and the cleaning module 31B are replaced with each other, it is unnecessary to change the installation of the pipe 63 of the fluid supply section 60 in the first accommodating section 50. Therefore, the replacement operation of the cleaning module 31 becomes easier. In addition, since this replacement operation only needs to replace the cleaning module 31 alone, handling is easy due to the small size (e.g., the width of 50 cm, the height of 70 cm, and the depth of 60 cm), and thus the operator's burden is reduced.

In addition, the cleaning module 31A and the cleaning module 31B respectively include the module cases 100 having a common size. With this configuration, since the module cases 100 have the common size, a replacement operation of the cleaning modules 31 may be performed in any of the first accommodating sections 50 as illustrated in FIG. 2. In addition, when the module cases 100 have the common size, it is unnecessary to manufacture the module cases 100 having different sizes for respective kinds when different kinds of cleaning modules 31 are manufactured, which may reduce the manufacturing cost.

In addition, as illustrated in FIG. 2, since each first accommodating section 50 is configured to accommodate cleaning modules 31 superimposed one on another in the height direction, substrates W may be cleaned in parallel with each other in each cleaning module 31 of the upper first lane L1 and each cleaning module 31 of the lower second lane L2, which increases throughput. In addition, since the cleaning modules 31 are superimposed one on another in the height direction, the footprint (installation area) of the entire apparatus does not increase.

As described above, according to the exemplary embodiment described above, it is possible to reduce a burden on the replacement operation of different kinds of cleaning modules by adopting a configuration, which includes multiple kinds of cleaning modules 31 that perform a cleaning processing, a first accommodating section 50 that is capable of accommodating the multiple kinds of cleaning modules 31, and a fluid supply section 60 that supplies a fluid to the cleaning modules 31 accommodated in the first accommodating section 50 via the pipe 63, and in which each of the multiple kinds of cleaning modules 31 includes a pipe connection portion 70 having a common connection position to be connected with the pipe 63.

In addition, it is possible to further reduce the operator's burden by optimizing a pipe connection position in a fluid supply section 60, as illustrated in FIGS. 9A and 9B, and FIGS. 10A and 10B. Meanwhile, in the following description, although the configuration of a chemical liquid supply unit 61 is exemplified, the same configuration may also be adopted in a pure water supply unit 62.

Figure 9A:
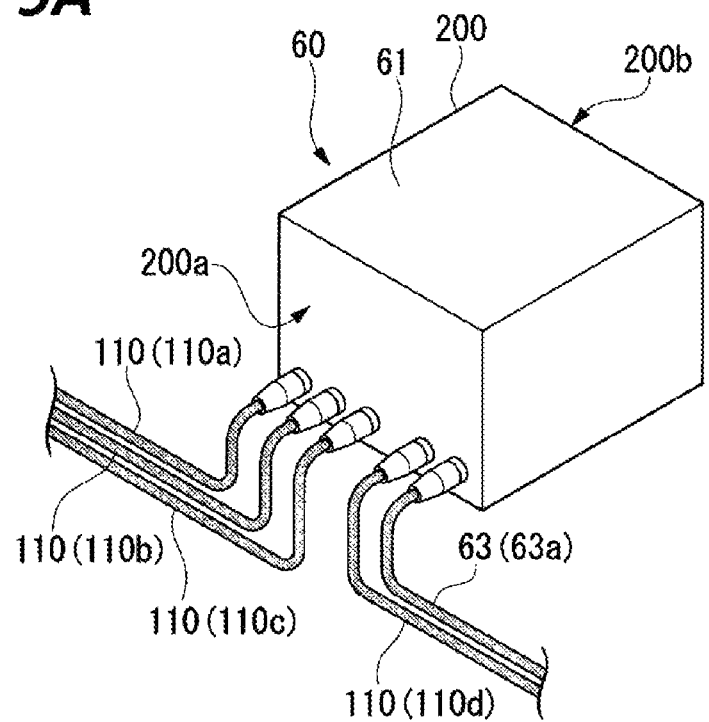
FIGS. 9A and 9B are perspective views illustrating the connected state and the removed state of the pipe 63 and other pipes 110, respectively, which are connected to a chemical liquid supply unit 61 in the fluid supply section 60 according to an exemplary embodiment.
Figure 9B:
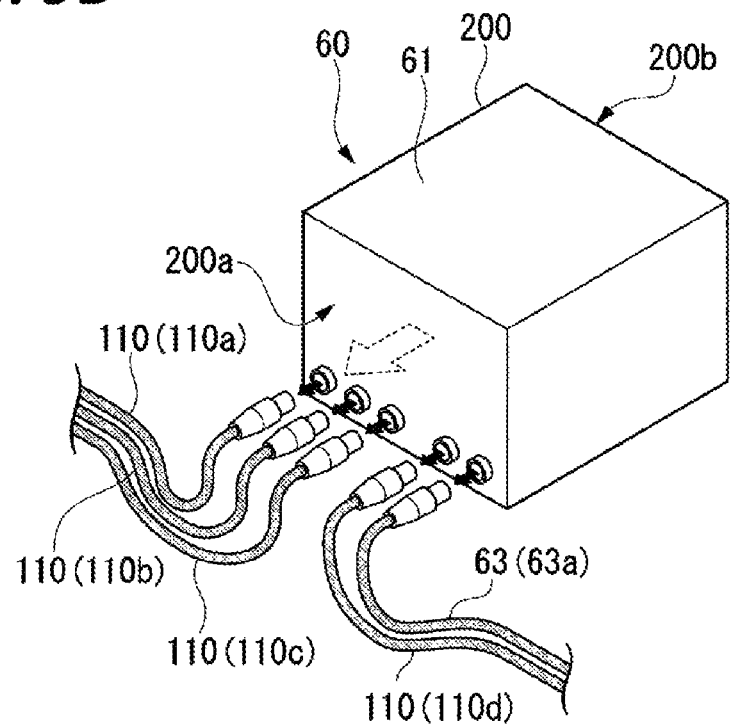

FIGS. 9A and 9B are perspective views respectively illustrating the connected state and the removed state of a pipe 63 and other pipes 110, which are connected to a chemical liquid supply unit 61 of the fluid supply section 60 according to an exemplary embodiment.

As illustrated in FIG. 9A, the chemical liquid supply unit 61 includes a pipe 63 (a chemical liquid pipe 63a) and other pipes 110. The other pipes 110 include, for example, a chemical liquid input pipe 110a that inputs a chemical liquid to the chemical liquid supply unit 61 from the outside, a pure water input pipe 110b that inputs pure water for diluting the chemical liquid to the chemical liquid supply unit 61 from outside, an air input pipe 110c that inputs air for driving an air operation valve to the chemical liquid supply unit 61 from the outside, and a drain pipe 110d that receives water drained from the cleaning module 31. All the pipes including the pipe 63 and the other pipes 110 are connected to the front side of a second accommodating section 51 (see, e.g., FIGS. 2 and 3) in the drawing-out direction of the chemical liquid supply unit 61 (the direction indicated by the dotted arrow in FIG. 9B). That is, the pipe 63 and the other pipes 110 are connected to a maintenance surface 200a, which is exposed to the outside of an outer case 200 of the chemical liquid supply unit 61. With this configuration, as illustrated in FIG. 9B, the operator may easily remove the pipe 63 and the other pipes 110 from the chemical liquid supply unit 61, and may then draw out the chemical liquid supply unit 61.

Figure 10A:
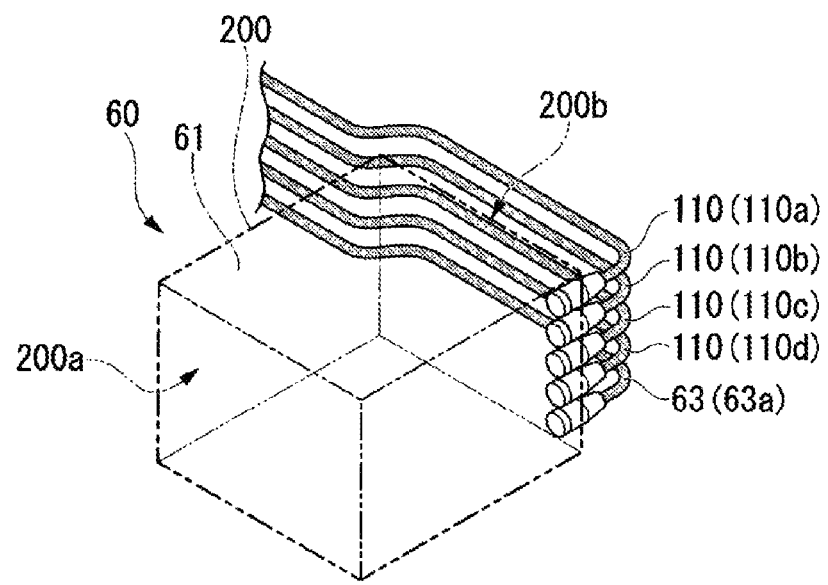
FIGS. 10A and 10B are perspective views illustrating the connected state and the unloaded state of the pipe 63 and the other pipes 110, respectively, which are connected to the chemical liquid supply unit 61 of the fluid supply section 60 according to an exemplary embodiment.
Figure 10B:
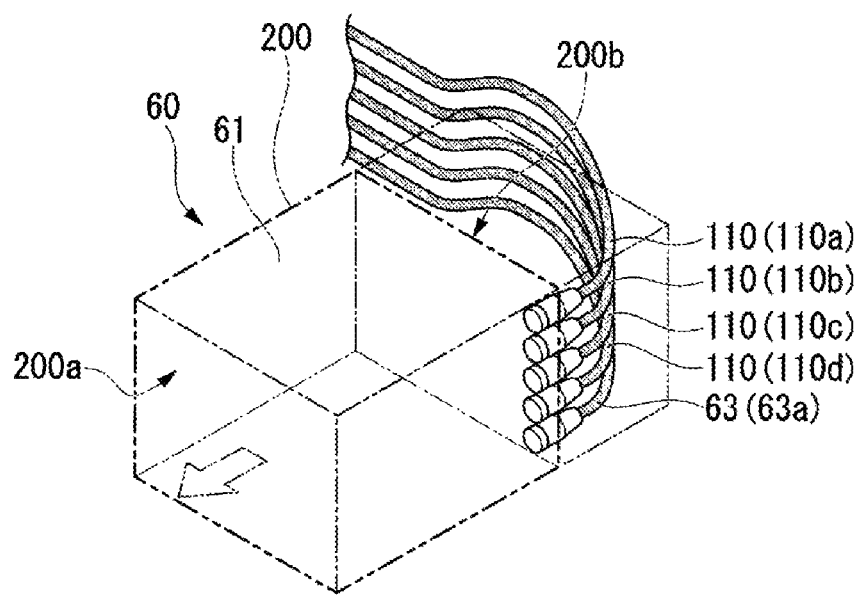

FIGS. 10A and 10B are perspective views respectively illustrating the connected state and the drawn-out state of a pipe 63 and other pipes 110, which are connected to a chemical liquid supply unit 61 of a fluid supply section 60 according to an exemplary embodiment.

In the example illustrated in the drawings, as illustrated in FIG. 10A, all the pipes including the pipe 63 and the other pipes 110 are connected to the inner side of the second accommodating section 51 in the drawing-out direction of the chemical liquid supply unit 61. That is, the pipe 63 and the other pipes 110 are connected to a rear surface 200b opposite to the maintenance surface 200a of the outer case 200 of the chemical liquid supply unit 61. In addition, the pipe 63 and the other pipes 110 are connected in a row in the height direction, and each has a margin in length (deflection) to some extent. With this configuration, as illustrated in FIG. 10B, while the pipe 63 and the other pipes 110 are connected (while the cleaning module 31 is being driven), the chemical liquid supply unit 61 may be drawn out for maintenance. In addition, after the chemical liquid supply unit 61 is drawn out, the pipe 63 and the other pipes 110 connected to the rear surface 200b may be easily removed.

In addition, according to the exemplary embodiment, the multiple kinds of cleaning modules 31, which perform a cleaning processing, may be configured such that the pressure loss value of each pipe in each cleaning module 31 is set in advance in consideration of the difference in the pressure loss of the pipe 63 when a fluid is supplied to a substrate W through the pipes (the connection pipes 82a, 83a, 92a, and 93a) used in each module, and when one cleaning module 31 is replaced with another kind of cleaning module 31, the controller 3 automatically corrects the pressure loss value of each pipe, which is set in order to control the discharge pressure of the fluid supplied in each cleaning module 31, before and after replacement. According to the present exemplary embodiment, since the connection position of the pipe 63 for a common fluid is common, the discharge pressure of the fluid to be supplied to each substrate W to be cleaned via the pipe may be promptly optimized by referring to the preset pressure loss value of each pipe in each cleaning module 31 even after the module is replaced.

For example, in the exemplary embodiments, although the configuration in which various cleaning modules 31 include a pipe connection portion 70 having a common connection position to be connected with the chemical liquid pipe 63a and a common connection position to be connected with the pure water pipe 63b has been described, only a connection position with one of the chemical liquid pipe 63a and the pure water pipe 63b may be common even though connection positions with both of the chemical liquid pipe 63a and the pure water pipe 63b are not common. Even with this configuration, the replacement burden is reduced as compared to the replacement operation of the conventional cleaning modules 31. In the present disclosure, the connection position of an air pipe (a module drive system 67), which supplies driving air as a fluid to a cleaning module 31, may be common.

In addition, for example, in the exemplary embodiments, although the kinds of cleaning modules 31 have been exemplified as a roll cleaning module and a pencil cleaning module, the present disclosure is not limited thereto, and other known cleaning modules such as, for example, a two-fluid cleaning module, a buff cleaning module, and an edge pen cleaning module may be employed.

In addition, for example, in the exemplary embodiments, although the configuration in which all of the multiple kinds of cleaning modules 31 have a main function of cleaning the top surface W1 of a substrate W (i.e., the front surface of the substrate W on which a pattern surface is provided) has been exemplified, for example, at least one of the multiple kinds of cleaning modules 31 may include a substrate holding unit that horizontally holds the bottom surface W2 of the substrate W facing downward (i.e., the rear surface of the substrate W on which no pattern surface is provided), a module side fluid supply unit that supplies a fluid (a cleaning liquid such as, for example, pure water, a chemical liquid, or a mixed liquid of pure water and a chemical liquid) to the bottom surface W2 of the substrate W held by the substrate holding unit, and a cleaning member that comes into contact with and cleans the bottom surface W2 of the substrate W when the substrate W is held by the substrate holding unit.

That is, in the case of a configuration in which the substrate processing apparatus 1 performs immersion exposure and double patterning processings in the next process, so to speak, a configuration that has a technical problem in that particles adhere to the bottom surface W2 side of a substrate W, a cleaning module (a rear surface cleaning module) may be provided, which has a main function of cleaning the bottom surface W2 of a substrate W by appropriately removing particles attached to the bottom surface W2 side of the substrate W.

Such a cleaning module may include, for example, a first substrate holding unit that horizontally attracts and holds a first region of the bottom surface W2 of a substrate W facing downward, a second substrate holding unit that receives the substrate W from the first substrate holding unit and horizontally attracts and holds a second region of the bottom surface W2 of the substrate W that does not overlap the first region, a module side fluid supply unit that supplies a fluid to the bottom surface W2 of the substrate W attracted and held by the first substrate holding unit or the second substrate holding unit, a drying device that dries the top surface W1 of the substrate W (the front surface on which a pattern surface is provided) (e.g., an IPA quantitative supply device and an IPA nozzle that supplies IPA to the substrate W so as to dry the substrate W), a cleaning member that cleans the bottom surface W2 of the substrate W including the second region while coming into contact with the bottom surface W2 when the substrate W is held by the first substrate holding unit, and cleans the bottom surface W2 of the substrate W excluding the second region while coming into contact with the bottom surface W2 when the substrate W is held by the second substrate holding unit (e.g., a physical cleaning member such as a roll), and a two-fluid supply nozzle that supplies so-called two fluids to the bottom surface W2 of the substrate W excluding the second region.

In addition, for example, a configuration in which the cleaning apparatus of the present disclosure is applied to a cleaning section 30 of a substrate processing apparatus 1 has been exemplified in the exemplary embodiments, the present disclosure may also be applied to, for example, a single cleaning apparatus used for cleaning a substrate, or a cleaning section of any apparatus other than a CMP apparatus (e.g., a rear surface polishing apparatus, a bevel polishing apparatus, an etching apparatus, or a plating apparatus).

In addition, for example, although a chemical mechanical polishing (CMP) apparatus, which flatly polishes the front surface of a substrate W such as, for example, a silicon wafer while supplying a polishing liquid has been exemplified in the exemplary embodiments, the cleaning apparatus of the present disclosure may also be applied, as an apparatus of cleaning a substrate W, which has been subjected to grinding and polishing, to a grinding apparatus that performs grinding on the rear surface of a substrate W by pressing a grinding wheel formed by fixing abrasive grains made of diamond with an adhesive such as, for example, a resin bond, against the rear surface of the substrate W while rotating the grinding wheel at a high speed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cleaning apparatus comprising:
a cleaning apparatus housing;
multiple kinds of cleaning modules each including a module housing and configured to perform a cleaning processing of a substrate;
a first accommodating section configured to releasably and interchangeably accommodate the multiple kinds of cleaning modules therein;
a fluid supply section configured to supply a fluid to a cleaning module accommodated in the first accommodating section through a pipe; and
a second accommodating section configured to accommodate the fluid supply section,
wherein the first accommodating section, the second accommodating section, and the fluid supply section being arranged within the cleaning apparatus housing, and
wherein each of the multiple kinds of cleaning modules includes a pipe connector mounted on the module housing of each of the multiple kinds of cleaning modules, each pipe connector having a common connection position configured to be connected with the pipe when one of the multiple kinds of cleaning modules is inserted into the first accommodating section, such that any of the multiple kinds of cleaning modules may be connected to the pipe.

2. The cleaning apparatus of claim 1, wherein the fluid supply section includes a pure water pipe configured to supply pure water as the fluid, a chemical liquid pipe configured to supply a chemical liquid as the fluid, and an air pipe configured to supply air for driving the cleaning modules as the fluid, and
the pipe connector is connected to at least one of the pure water pipe, the chemical liquid pipe, and the air pipe.

3. The cleaning apparatus of claim 1, wherein at least one of the multiple kinds of cleaning modules includes:

a roll cleaning module including a first rotation mechanism configured to rotate the substrate, a first top surface fluid supply nozzle configured to supply the fluid to a top surface of the substrate, a first bottom surface fluid supply nozzle configured to supply the fluid to a bottom surface of the substrate, and a roll cleaning member configured to rotate while bringing a peripheral surface thereof into contact with the substrate; and a pencil cleaning module including a second rotation mechanism configured to rotate the substrate, a second top surface fluid supply nozzle configured to supply the fluid to the top surface of the substrate, a second bottom surface fluid supply nozzle configured to pass through a rotating shaft of the second rotation mechanism and supply the fluid to the bottom surface of the substrate, and a pencil cleaning member configured to rotate by bringing an end surface thereof into contact with the substrate, and the pencil cleaning module further includes:

a pipe extension portion configured to communicate with the second bottom surface fluid supply nozzle, led to an outside of a module case from the rotating shaft of the second rotation mechanism, and installed to extend to a connection position at which the first bottom surface fluid supply nozzle is connected to the pipe; and a pipe cover attached to the module case to cover the pipe extension portion.

4. The cleaning apparatus of claim 1, wherein at least one of the multiple kinds of cleaning modules comprises a cleaning module selected from a two-fluid cleaning module, a buff cleaning module, and an edge cleaning module.

5. The cleaning apparatus of claim 1, wherein each of the multiple kinds of cleaning modules includes a module case having a common size.

6. The cleaning apparatus of claim 1, wherein the first accommodating section accommodates the multiple kinds of cleaning modules to be superimposed one on another in a height direction.

7. The cleaning apparatus of claim 1, wherein the second accommodating section is configured to accommodate the fluid supply section in a manner in which the fluid supply section is capable of being drawn out, wherein the fluid supply section includes the pipe and a second pipe that is different from the pipe, and all pipes including the pipe and the second pipe are connected to a front side or an inner side of the fluid supply section in a drawing-out direction.

8. The cleaning apparatus of claim 1, wherein at least one of the multiple kinds of cleaning modules includes:

a substrate holding unit configured to horizontally hold the bottom surface of the substrate;

a module side fluid supply unit configured to supply the fluid to the bottom surface of the substrate held by the substrate holding unit; and a cleaning member configured to comes into contact with and clean the bottom surface of the substrate while the substrate is held by the substrate holding unit.

9. A substrate processing apparatus comprising:

a substrate transfer section configured to transfer a substrate;

a polishing section configured to polish the substrate; and a cleaning section configured to clean the substrate, wherein the cleaning section includes the cleaning apparatus of claim 1.

10. The cleaning apparatus of claim 1, wherein the first accommodating section includes a first lane configured to accommodate at least one of the multiple kinds of cleaning modules and a second lane configured to accommodate at least one of the multiple kinds of cleaning modules, wherein the first lane is positioned above the second lane.

11. The cleaning apparatus of claim 1, wherein the pipe includes at least one protective tube covering the pipe, the at least protective tube configured to connect with the pipe connector to supply fluid from the fluid supply section to the pipe connector.

* * * * *